United States Patent [19]
Kobayashi

[11] Patent Number: 5,169,800
[45] Date of Patent: Dec. 8, 1992

[54] METHOD OF FABRICATING SEMICONDUCTOR DEVICES BY LASER PLANARIZATION OF METAL LAYER

[75] Inventor: Koichi Kobayashi, Yokohama, Japan
[73] Assignee: Fujitsu Limited, Kanagawa, Japan
[21] Appl. No.: 629,795
[22] Filed: Dec. 19, 1990
[30] Foreign Application Priority Data
Dec. 26, 1989 [JP] Japan .................................. 1-340971
[51] Int. Cl.[5] ........................................... H01L 21/28
[52] U.S. Cl. .................................... 437/188; 156/652; 156/653; 437/173; 437/174; 437/203
[58] Field of Search ............... 437/174, 173, 187, 188, 437/203; 148/DIG. 56, DIG. 93; 156/652, 653

[56] References Cited
U.S. PATENT DOCUMENTS

| | | | |
|---|---|---|---|
| 4,674,176 | 6/1987 | Tuckerman | 29/591 |
| 4,758,533 | 7/1988 | Magee et al. | 437/173 |
| 4,800,179 | 1/1989 | Mukai | 437/203 |
| 4,920,070 | 4/1990 | Murai | 437/173 |

FOREIGN PATENT DOCUMENTS 0260319 11/1987 Japan .................................. 437/203
0066953 3/1989 Japan .................................. 437/203

OTHER PUBLICATIONS

Incropera et al., "Funoamentals of Heat and Mass Transfer", John Wiley & Sons, New York, NY (1985) p. 38.

Primary Examiner—Olik Chaudhuri
Assistant Examiner—Ken Horton
Attorney, Agent, or Firm—Nikaido, Marmelstein, Murray & Oram

[57] ABSTRACT

A method of fabricating semiconductor devices, includes the steps of (a) forming a plurality of insulating films on a base layer, the plurality of insulating films includes at least a lower layer insulating film and an upper layer insulating film, the lower layer insulating film being smaller in etch rate than the upper layer insulating film and serving as an etching stopper, (b) forming a first opening portion by etching the upper layer insulating film, and exposing the lower layer insulating film to the first opening portion, (c) forming a second opening portion smaller in width than the first opening portion by etching the lower layer insulating film exposed to the first opening portion, and exposing the base layer to the second opening portion, (d) forming a metal layer in the first and second opening portions so that it can contact with the base layer exposed to the second opening portion, and (f) burying the metal layer in the first and second opening portions and planarizing the buried metal layer by irradiating the metal layer with a laser beam.

18 Claims, 10 Drawing Sheets

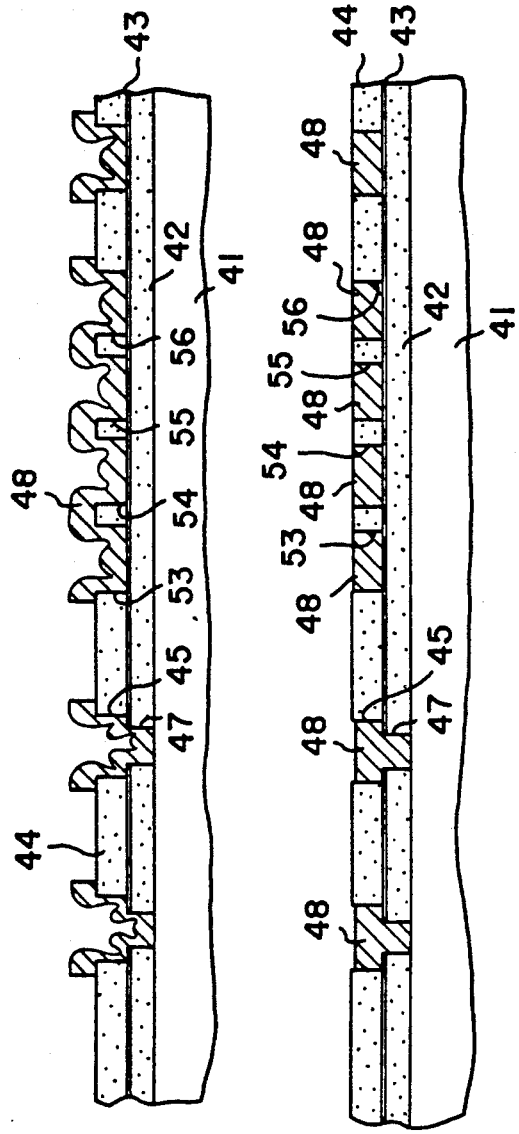
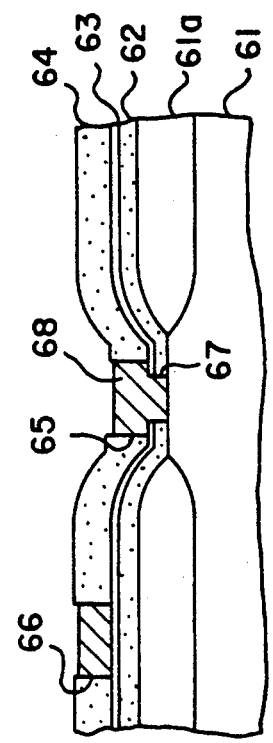
Fig.3(a)
Fig.3(b)
Fig.4

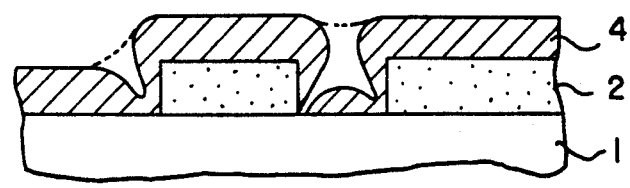
Fig.11  PRIOR ART
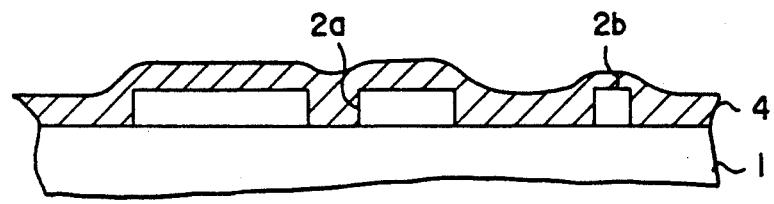
Fig.12(a) PRIOR ART
Fig.12(b) PRIOR ART
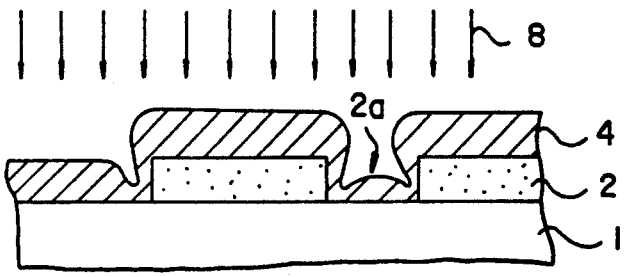
Fig.13(a) PRIOR ART
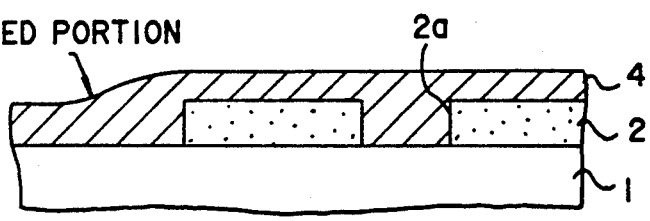
Fig.13(b) PRIOR ART

METHOD OF FABRICATING SEMICONDUCTOR DEVICES BY LASER PLANARIZATION OF METAL LAYER

FIELD OF THE INVENTION

The present invention relates to a method of fabricating semiconductor devices and more particularly to a method of fabricating semiconductor devices wherein, for a wiring method within the semiconductor device, a local burnout of wiring and an increase in resistance are prevented by planarizing a metal layer.

DESCRIPTION OF THE PRIOR ART

With the reduction in the size of semiconductor devices in recent years, the wiring dimensions that connect between elements become much smaller and smaller. Since the wirings connecting between elements are formed on the irregularities on the semiconductor device surface caused during processes, the local burnout of the wirings tends to occur at the irregularity portions, and the film thickness of a conductive substance becomes thin, thereby resulting in an increase in the resistance. As the size of semiconductor devices is reduced, the rate of occurrence of the wiring burnout and the like becomes high. Therefore, a fabrication method is required which can prevent the wiring burnout and the like by planarizing the irregularities described above.

A conventional method of fabricating semiconductor devices of the above kind will hereinafter be described in conjunction with the drawings.

FIGS. 9 and 10 are diagrams used for explaining a first conventional example in which a wiring layer is planarized by devising a method of growing the wiring layer.

In FIGS. 9 and 10, reference numeral 1 is an n-type silicon (Si) substrate, 2 an insulating film, 3 a resist film, 4 a wiring layer containing aluminum (Al) or Al compound, and 5 a p-type diffused layer formed in the Si substrate 1.

In the fabrication method of the first conventional example, as shown in FIG. 9(a), after the insulating layer 2 has been grown on the substrate 1 in which the p-type diffused layer 5 is formed, the resist film 3 is coated and patterned. Next, an opening portion 2a is formed in the insulating layer by etching, as shown in FIG. 9(b). After formation of the opening portion 2a, the wiring layer 4 is grown on the opening portion 2a and on the insulating layer 2 by a heated and biased sputtering method, as shown in FIG. 9(c). The wiring layer 4 is then etched and formed into a predetermined shape, as shown in FIGS. 9(d) and 10.

In the fabrication method of semiconductor devices described above, since the wiring layer 4 is slightly etched while it is growing and since viscous flow occurs, the planarizing of the wiring layer 4 is achieved as shown by the broken lines in FIG. 11, although a normal sputtering causes insufficient film thickness locally as shown in by the solid line in FIG. 11.

However, the above described fabrication method has its disadvantages in that, as shown in FIG. 12(a), the film thickness of the wiring layer 4 becomes slightly thin above the opening portion 2a and also becomes extremely thin above the isolated layer 2b. In addition, since the substrate 1 is heated to a temperature of the order of 400° during growth of the wiring layer 4, Al of the wiring layer 4 reacts on Si of the p-type diffused layer 5 of the substrate 1 and then an compound layer 7 composed of Al and Si is formed, as shown in FIG. 12(b). This results in an increase in contact resistance and breakdown of p-n junction in the substrate 1.

FIGS. 13(a) and 13(b) are diagrams used to explain a second conventional example in which a wiring layer is planarized by irradiating laser beams. In the figures, the same reference numerals as the first conventional example will be applied to the same or corresponding parts.

In the fabrication method of the second conventional example, an insulating layer 2 is grown on a substrate 1 and an opening portion 2a is formed by etching, as in the case of the first conventional example. Next, a wiring layer 4 is grown on the opening portion 2a and on the insulating layer 2 by a normal sputtering method. As shown in FIG. 13(a), high-output laser beams 8 of extremely short pulse width are then irradiated on the surface of the wiring layer 4. Consequently, the wiring layer 4 is instantaneously melted and viscously flows and is planarized, as shown in FIG. 13(b). In this method, a chemical reaction between the wiring layer 4 and the p-type silicon layer 1, which is the problem of the first conventional example, can be extremely decreased by making the irradiation time of the laser beams 8 several tens of nanoseconds and making the cooling time longer (several milliseconds).

However, even this method has the same disadvantage as the above described example in that the film thickness of the wiring layer 4 above the opening portion 2a tends to be thin as shown in FIG. 13(a) and that the reduced portion of the wiring layer 4 itself as shown in the left side of FIG. 13(b) tends to occur. In addition, if the laser beams 8 are irradiated after the patterning of the wiring layer 4, they are irradiated directly on the exposed parts of the substrate 1 and insulating film 2, and the elements formed on the substrate 1 sometimes suffer damages.

As described above, in the first and second conventional example, it is difficult to completely eliminate the reduced portion of the wiring layer 4 itself caused by the land and groove portions which are formed on the substrate 1 by the insulating film 2.

FIG. 14 shows a third conventional example in which the reduced portion of the wiring layer itself as described above hardly occurs.

In the figure, reference numeral 11 is a semiconductor substrate, 12 an insulating film, 13 a first resist film, 14 an conductive wiring layer, 15 a second resist film, and 16 a third resist film.

In the fabrication method of the third conventional example, as shown in FIG. 14(a), after the insulating layer 12 has been grown on the substrate 11 by a chemical vapor deposition (CVD) method, the first resist film 13 is applied and patterned. Next, as shown in FIG. 14(b), by etching the insulating film 12 with the patterned first resist film 13, grooves 12a and 12b each having a predetermined width are formed. After formation of the grooves, the second resist film 15 is applied on the insulating film 12 and patterned. As shown in FIG. 14(c), the insulating film 12 is then etched to form an opening portion 12c underneath the opening portion 12a, and the wiring layer 14 is grown on the insulating film 12 by sputtering so that the grooves 12a, 12b, and the opening portion 12c can be completely covered. The third resist film 16 on the wiring layer 14 is patterned as a mask for etching of the wiring layer 14. By etching the wiring layer 14, it is buried in only the grooves 12a, 12b and opening portion 12c, as shown in FIG. 14(d). Since in this method the wiring layer 14 is buried in the grooves 12a, 12b and opening portion 12c, the irregularities on the substrate 11 after wiring can be reduced to a very small size.

However, even a fabrication method of semiconductor devices such as the third conventional example must control an amount of etching for forming the groove 12 with high accuracy and make the depths of the groove 12a and opening portion 12c uniform, because the groove 12a and the window 12c underneath the groove 12a, which are different in width, are formed in the insulating film 12 of a single layer. Therefore, if the wafer size of the substrate 11 becomes large, the depth of the groove 12a cannot be controlled since the surface area at the time of etching becomes large. When the groove 12a became shallow, the irregularities on the wiring layer 14 occur on the surface of the insulating layer 12 and the formation of the groove 12a becomes ineffective. When, on the other hand, the groove 12a became deep, there is the problem that the wiring capacity of the wiring layer 14 increases and thus the operating speed of the circuit is decreased. Furthermore, in a case where the size of the device is considerably reduced, the misregistration of the grooves 12a and 12b tend to occur at the time of exposure in the patterning process of the wiring layer 14. Consequently, there is the problem that, after the etching of the wiring layer 14, a gap 17 is formed in the end portion of the groove 12a, or the wiring layer 14 protrudes from the groove 12a over the surface of the insulating film 12, as shown in FIG. 15. For this reason, even in a case where the space between adjacent grooves 12a is very narrow, the wiring layer 14 must be patterned so that the space between the wiring layers 14 becomes narrow, in order to prevent a groove in the form of a crevasse which is caused by the misregistration of patterning. Consequently, a short circuit is liable to arise between adjacent wiring layers 14.

Accordingly, it is an object of the present invention to provide a method of fabricating semiconductor devices which is capable of easily and accurately controlling the depth of a groove in which a wiring layer is buried.

SUMMARY OF THE INVENTION

In order to achieve the above object, a method of fabricating semiconductor devices according to a first invention comprises the steps of (a) forming a plurality of insulating films on a base layer, the plurality of insulating films comprising at least a lower layer insulating film and an upper layer insulating film, the lower layer insulating film being smaller in etch rate than the upper layer insulating film and serving as an etching stopper, (b) forming a first opening portion by etching the upper layer insulating film, and exposing the lower layer insulating film to the first opening portion, (c) forming a second opening portion smaller in width than the first opening portion by etching the lower layer insulating film exposed to the first opening portion, and exposing the base layer to the second opening portion, (d) forming a metal layer in the first and second opening portions so that it can contact with the base layer exposed to the second opening portion, and (e) burying the metal layer in the first and second opening portions and planarizing the buried metal layer by irradiating the metal layer with a laser beam.

In the first invention, after the lower layer insulating film having a smaller etch rate and the upper layer insulating film having a larger etch rate have been formed sequentially on the base layer, the first opening portion is formed in the upper layer insulating film by etching. The second opening portion smaller in width than the first opening portion is then formed by etching the lower layer insulating film exposed to the first opening portion. After the metal layer has been formed in the first and second opening portions so that it can contact with the base layer exposed to the second opening portion, the metal layer is buried in the first and second opening portions and planarized by irradiating the metal layer with laser beams.

Consequently, since the lower layer insulating film serves as an etching stopper as the first opening portion is formed by etching, the first opening portion can be easily and accurately formed to have a predetermined length, and there is no fluctuation in the depth of the first opening portion that will be caused by the conventional method. In addition, since the metal layer is melted and buried in the first opening portion and second opening portion by irradiation of the laser beams, the metal layer is uniformly buried in the first opening portion and second opening portion, the gap within the first opening portion and projection of the metal layer from the first opening portion as produced by the conventional method are prevented. As a result, the planarizing of the metal layer is completely achieved and thereby can prevent a decrease in the operating speeds of circuits after wirings and prevent a short circuit between adjacent metal layers.

In order to achieve the above object, a method of fabricating semiconductor devices according to a second invention comprises the steps of (a) forming a plurality of insulating films on a base layer, the plurality of insulating films comprising at least a first insulating film, a second insulating film, and a third insulating film, the second insulating film being smaller in etch rate than the first and third insulating films and serving as an etching stopper and as a light shading film, (b) forming a first opening portion by etching the third insulating film, and exposing the second insulating film to the first opening portion, (c) forming a second opening portion smaller in width than the first opening portion by etching the second insulating film exposed to the first opening portion and etching the first insulating film, and exposing the base layer to the second opening portion, (d) forming a metal layer in the first and second opening portions so that it can contact with the base layer exposed to the second opening portion, and (e) burying the metal layer in the first and second opening portions and planarizing the buried metal layer by irradiating the metal layer with a laser beam.

In the second invention, the first insulating film, the second insulating film, and the third insulating film are formed sequentially on the base layer. By using the second insulating film smaller in etch rate than the first and third insulating films as an etching stopper and as a light shading file, the first opening portion is formed in the third insulating film by etching. Next, the second opening portion is formed by etching the second insulating film exposed to the first opening portion and etching the first insulating film. After the metal layer has been formed in the first and second opening portions so that it can contact with the base layer exposed to the second opening portion, the metal layer is buried in the first and second opening portions and planarized by irradiating the metal layer with laser beams.

Consequently, the first opening portion can be easily and accurately formed to have a depth proportional to the film thickness of the third insulating film. The second opening portion can also be easily formed to have a desired depth by adjusting the film thickness of the first and second insulating films. As a result, the planarizing of the metal layer is completely achieved and thereby can prevent a decrease in the operating speeds of circuits after wirings and prevent a short circuit between adjacent metal layers.

In order to achieve the above object, a method of fabricating semiconductor devices according to a third invention comprises the steps of (a) forming a first insulating film and a second insulating film of a plurality of insulating films sequentially on a base layer, the second insulating film being smaller in etch rate than the first insulating film and a third insulating film of the plurality of insulating films and serving as an etching stopper and as a light shading film, (b) forming a first opening portion by etching the second insulating film, and exposing the first insulating film to the first opening portion, (c) forming the third insulating film on the second insulating film so that the second insulating film and the first opening portion are covered with the third insulating film, (d) by etching the third insulating film and first insulating film, forming a second opening portion, which is larger in width than the first opening portion, in the third insulating film on the first opening portion and also forming a third opening portion, which is substantially equal in width to the first opening portion, in the first insulating layer, and exposing the base layer to the third opening portion, (e) forming a metal layer in the first, second and third opening portions so that it can contact with the base layer exposed to the third opening portion, and (f) burying the metal layer in the first, second and third opening portions and planarizing the buried metal layer by irradiating the metal layer with a laser beam.

In the third invention, the first insulating film and the second insulating film, which is smaller in etch rate than the first insulating film and third insulating film, are formed sequentially on the base layer. After the first opening portion has been formed by etching the second insulating film, the third insulating film is formed on the second insulating film so that the second insulating film and the first opening portion are covered with the third insulating film. Next, by etching the third insulating film and first insulating film at the same time, the second opening portion, which is larger in width than the first opening portion, is formed in the third insulating film on the first opening portion, and also the third opening portion, which is substantially equal in width to the first opening portion, is formed in the first insulating layer. After the metal layer has been in the first, second and third opening portions, the metal layer is buried in the first, second and third opening portions and is planarized by a laser annealing processing.

Consequently, by using the second insulating film as an etching stopper and as a light shading film, the second opening portion can be easily and accurately formed, and at the same time the second opening portion and the third opening portion, which are different in width, are formed, thereby reducing the number of processes. In addition, the planarizing of the metal layer is completely achieved and thereby can prevent a decrease in the operating speeds of circuits after wirings and prevent a short circuit between adjacent metal layers.

In order to achieve the above object, a method of fabricating semiconductor devices according to a fourth invention comprises the steps of (a) forming a first insulating film and a second insulating film of a plurality of insulating films sequentially on a base layer, the second insulating film being smaller in etch rate than the first insulating film and a third insulating film of the plurality of insulating films and serving as an etching stopper and as a light shading film, (b) forming a first opening portion by etching the second and first insulating films, (c) forming the third insulating film on the second insulating film so that the second insulating film and the first opening portion are covered with the third insulating film, (d) by etching the third insulating films, forming a second opening portion, which is larger in width than the first opening portion, in the third insulating film on the first opening portion and also forming a sidewall insulating film on sidewalls of the first and second insulating films within the first opening portion and further exposing the base layer to an opening portion defined by the sidewall insulating film, (e) forming a metal layer in the first and second opening portions so that it can contact with the base layer exposed to the opening portion defined by the sidewall insulating film, and (f) burying the metal layer in the first and second opening portions and planarizing the buried metal layer by irradiating the metal layer with a laser beam.

In the fourth invention, the first insulating film and the second insulating film, which is smaller in etch rate than the first insulating film and the third insulating film, are formed sequentially on the base layer. Next, the first opening portion is formed by etching the second and first insulating films, and the third insulating film is formed on the second insulating film so that the second insulating film and the first opening portion are covered with the third insulating film. Next, the second opening portion, which is larger in width than the first opening portion, is formed in the third insulating film on the first opening portion, and also the sidewall insulating films is formed on sidewalls of the first and second insulating films within the first opening portion. After the metal layer has been formed in the first and second opening portions, it is buried in the first and second opening portions by irradiating the metal layer with laser beams.

Consequently, by using the second insulating film as an etching stopper and as a light shading film, the second opening portion can be easily and accurately formed to have a predetermined depth. The smaller window for contact is formed within the first opening portion and thereby enhances the operating speed of elements. In addition, the planarizing of the metal layer is completely achieved and thereby can prevent a decrease in the operating speeds of circuits after wirings and prevent a short circuit between adjacent metal layers.

In addition, one of the above described plurality of insulating films may have absorption rate more than 30% with respect to a laser beam. The above described base layer may comprise aluminum, aluminum base compound, copper, copper base compound, single crystal silicon, polycrystal silicon, or compound semiconductor such as GaAs and AlGaAs. The above described upper or first insulating film may comprise a silicon (Si) oxidation film or a Si oxidation film containing phosphorus (P), the second insulating film may comprise $Al_2O_3$, and the third insulating film may comprise a silicon (Si) oxidation film or a Si oxidation film containing phosphorus (P). The above described laser beam may comprise an excimer laser beam. In the case, the metal layer comprises aluminum (Al), Al base compound, copper (Cu), or Cu base compound.

BRIEF DESCRIPTION OF THE DRAWINGS

The drawbacks of a prior-art method of fabricating semiconductor devices and the features and advantages of a method of fabricating semiconductor devices according to the present invention will be more clearly understood from the following description taken in conjunction with the accompanying drawings:

FIGS. 2(a)-2(e) and FIGS. 3(a)-3(b) are cross sectional views, partly broken away, representing the essential steps in one embodiment of a method of fabricating semiconductor devices according to a second invention;

FIG. 4 is a cross sectional view, partly broken away, representing the essential steps in another embodiment of a method of fabricating semiconductor devices according to the second invention;

FIG. 11 is a cross sectional view, partly broken away, of the semiconductor device formed by the conventional method of FIG. 9;

FIGS. 12(a)-12(b) are cross sectional views to explain the problems as produced by the conventional method of FIG. 9;

FIGS. 13(a)-13(b) are cross sectional views to explain the problems as produced by another conventional method of fabricating semiconductor devices;

DESCRIPTION OF THE PREFERRED EMBODIMENTS

Figure 1A:
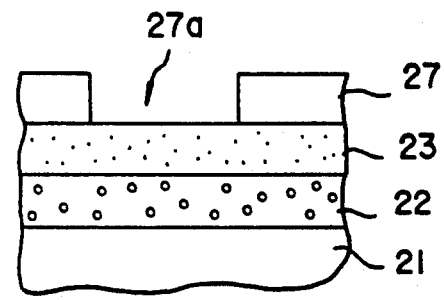
FIGS. 1(a)-1(e) are cross sectional views, partly broken away, representing the essential steps in one embodiment of a method of fabricating semiconductor devices according to a first invention.

The present invention will hereinafter be described in conjunction with the drawings.

FIG. 1 is a diagram used to explain an embodiment of a method of fabricating semiconductor devices according to a first invention.

In FIG. 1, reference numeral 21 is a base layer comprising a conductive material or semiconductor (e.g., aluminum or aluminum base compound, copper or copper base compound, single crystal silicon or polycrystal silicon, and compound semiconductor such as GaAs and AlGaAs), 22 a lower layer insulating film, 23 an upper layer insulating film, 24 a first opening portion formed in the upper layer insulating film 23, 25 a second opening portion formed in the lower layer insulating film 22, 26 a metal layer, 27 a first resist film, 28 a second resist film, 29 a third resist film, and 30 a laser beam.

The fabrication method will hereinafter be described.

First, as shown in FIG. 1(a), the lower layer insulating film 22 (e.g., alumina ($Al_2O_3$)) is deposited on the base layer 21 by sputtering so that it has a predetermined film thickness (e.g., 0.3 $\mu$m). The upper layer insulating film 23 (e.g., PSG) larger in etch rate than the lower layer insulating film 22 is then deposited on the lower layer insulating film 22 by a chemical vapor deposition (CVD) method, and the deposited upper layer insulating film 23 has a film thickness of the order of 0.7 $\mu$m. A resist film is coated on the upper layer insulating film 23 and the first resist film 27 is formed. The first resist film 27 is patterned by a known exposure and development so that it is formed with a predetermined opening portion 27a, and the patterned first resist film 27 remains on the region other than a wiring region (opening portion 27a).

Figure 1B:
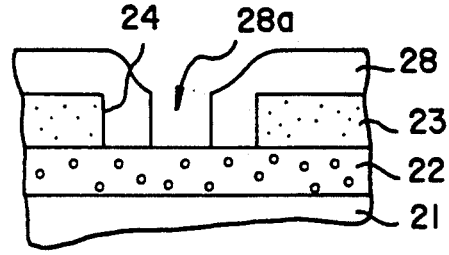

Next, as shown in FIG. 1(b), by using the patterned resist film 27 as a mask and the lower layer insulating film 22 as an etching stopper, the upper layer insulating film 23 is selectively etched with, for example, $CHF_4$ gas by a RIE (reactive-ion etching) method so that the first opening portion 24 corresponding to the opening portion 27a is formed to have a width of the order of 1.8 $\mu$m-4 $\mu$m and that the lower layer insulating film 22 is exposed to the first opening portion 24. A resist film is then coated to form the second resist film 28 with which the upper layer insulating film 23 and the first opening portion 24 are completely covered. The second resist film 28 is patterned by a known exposure and development so that an opening portion 28a is formed therein.

Figure 1C:
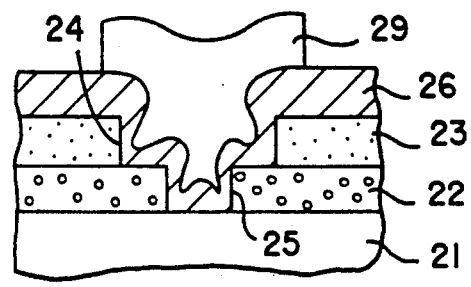

Next, as shown in FIG. 1(c), by using the patterned second resist film 28 as a mask, the lower layer insulating film 22 is etched with, for example, argon gas (Ar) so that the second opening portion 25 smaller in width than the first opening portion 24 is formed and serves as a contact window. The base layer 21 is exposed to the second opening portion 25 formed in the lower layer insulating film 22. Thereafter, for example, Al or Al compound (for example, contains Si or Cu) is grown to a thickness of the order of 0.6 $\mu$m by sputtering to cover the first opening portion 24, second opening portion 25 and surface of the upper layer insulating film 23. Consequently, the metal layer 26 for wiring is formed and contacts with the base layer 21, as shown in FIG. 1(c). A resist film is then coated on the metal layer 26 to form the third resist film 29. The third resist film 29 is patterned by a known exposure and development so that the resist film 29 becomes slightly larger in width than the first opening portion 24 by about 0.5 μm at one side.

Figure 1D:
Figure 1D:
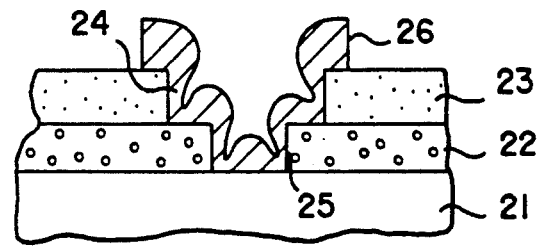
Figure 1E:
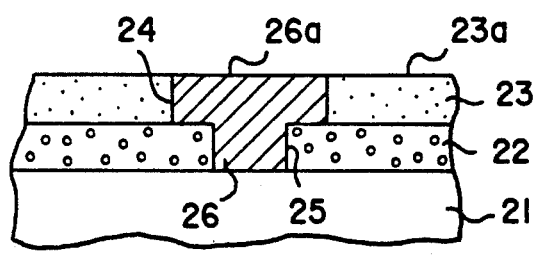

Next, as shown in FIG. 1(d), by using the patterned third resist film 29 as a mask, the portion of the metal layer 26 which is deposited in a place spaced more than a predetermined dimension (e.g., about 0.5 μm) from the first opening portion 24 is etched and removed with mixed gases of $CCl_4$ gas and $BCl_3$ gas. The remaining metal layer 26 is irradiated by the laser beam 30 of short wavelength and high density (e.g., excimer laser). The irradiated metal layer 26 melts and viscously flows, and is buried in the first and second opening portions 24 and 25 and planarized, as shown in FIG. 1(e). The laser beams 30 are irradiated with, for example, a pulse width of 50 ns, pulse energy of 150 mJ, pulse irradiation dimension of 2 mm ×2 mm, pulse feed pitch of 0.5 mm, and base layer (21) temperature of 300° C.

Since in the embodiment described above the lower layer insulating film 22 smaller in etch rate than the upper layer insulating film 23 is used as an etching stopper, the first opening portion 24 can be easily formed to have a desired depth. In addition, since the metal layer 26 irradiated by the laser beam 30 melts and viscously flows, the first and second opening portions 24 and 25 are filled up with the metal layer 26, and the upper surface 26a of the metal layer 26 becomes substantially flush with the upper surface 23a of the upper layer insulating film 23 due to surface tension. Consequently, the metal layer 26 for wiring can be made planar and uniform. This can prevent a decrease in the operating speed of a circuit caused by an increase in a wiring capacity and also prevent a short circuit between the metal layers 26 even if they are close to each other.

In addition, since the lower layer insulating film 22 comprises $Al_2O_3$ and is formed to a relatively thicker film (more than 0.1 μm), the film 22 has absorption rate more than 30% with respect to the laser beam 30 and therefore can prevent damages to the base layer 21 caused by laser irradiation.

FIGS. 2 and 3 illustrate one embodiment of a method of fabricating semiconductor devices according to a second invention.

In FIGS. 2 and 3, reference numeral 41 is a base layer (e.g., a silicon (Si) substrate), 42 a first insulating film (e.g., PSG), 43 a second insulating film (e.g., alumina ($Al_2O_3$), 44 a third insulating film (e.g., PSG), 45 a first opening portion formed in the third insulating film 44, 46 an opening portion formed in the third insulating film 44 in close vicinity to the first opening portion 45, 47 a second opening portion formed in the first and second insulating films 42 and 43 and smaller in width than the first opening portion 45, 48 a metal layer for wiring (e.g., Al or Al compound), 49 a first resist film, 50 a second resist film, 51 a third resist film, and 52 a laser beam.

The fabrication method of FIG. 2 will hereinafter be described.

Figure 2A:
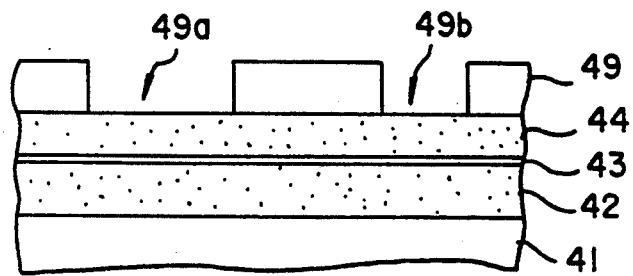

First, as shown in FIG. 2(a), a PSG film is grown on the base layer 41 by a chemical vapor deposition (CVD) method, and the first insulating film 42 is formed and has a film thickness of the order of 0.7 μm. Alumina ($Al_2O_3$)) is then deposited on the first insulating film 42 by sputtering and the second insulating film 43 having a film thickness of the order of 0.15 μm is formed. Further, a PSG film is grown on the second insulating film 43 by the chemical vapor deposition (CVD) method, and the third insulating film 44 is formed. A resist film is coated on the third insulating film 44, and the first resist film 49 is formed. The first resist film 49 is patterned by a known exposure and development so that it is formed with predetermined opening portions 49a and 49b, and the patterned first resist film 49 remains on the regions other than wiring regions (opening portions 49a and 49b).

Figure 2B:
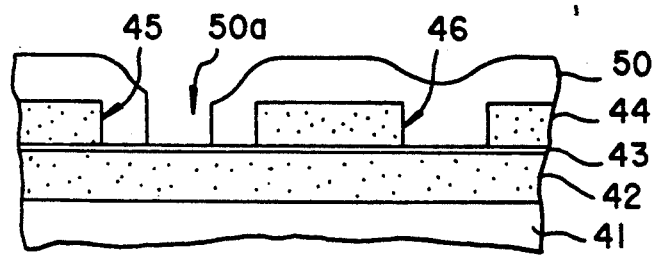

Next, as shown in FIG. 2(b), by using the patterned third resist film 49 as a mask, the third insulating film 44 is etched by the RIE method so that the first opening portion 45 and opening portion 46 respectively corresponding to the opening portions 49a and 49b are formed. The first opening portion 45 has a width of the order of 1.8 μm–4 μm, and the minimum space between the opening portions 45 and 46 is 0.6 μm. At the same time, the second insulating film 43 is exposed to the opening portions 45 and 46. The gas used in the RIE is $CHF_3$, the gas pressure is 0.05 Torr, and the high-frequency electric power is 13.56 MHz and 4 W/cm². Since in this condition the second insulating film 43 comprising $Al_2O_3$ is not etched and only the third insulating film 44 comprising PSG is etched, selectivity is excellent. A resist film is coated to form the second resist film 50 with which the third insulating film 44 and the opening portions 45 and 46 are covered. The second resist film 50 is patterned by a known exposure and development and formed with an opening portion 50a to which the second insulating film 43 is exposed.

Figure 2C:
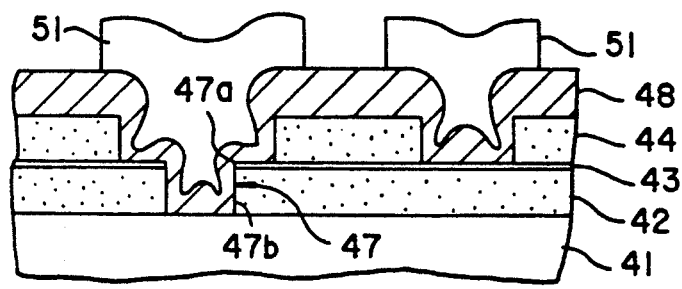

Next, as shown in FIG. 2(c), by using the second resist film 50 as a mask, the second insulating film 43 is etched and formed with an opening portion 47a smaller in width than the first opening portion 45, and the first insulating film 42 is exposed to the opening portion 47a. At this time, the etching gas is, for example, argon gas (Ar) having a gas pressure of 0.01 Torr, and the etching device with an electric power of 5 W/cm² is the same as the etching device (not shown) for forming the third insulating film 44. Although in this case the selectivity is not excellent, there is no problem, since the lowest insulating film 42 is next etched. With the same etching device, the first insulating film 42 is etched with $CHF_3$ gas and formed with an opening portion 47b which is substantially identical in width with the opening portions 50a and 47a. At the same time, the base layer 41 is exposed to the second opening portion 47 consisting of the opening portions 47a and 47b. Thereafter, for example, Al or Al compound is grown to a thickness of the order of 0.6 μm by sputtering to cover the second opening portion 47, opening portion 46 and third insulating layer 44. Consequently, the metal layer 48 for wiring is formed and contacts with the base layer 41, as shown in FIG. 2(c). A resist film is then coated on the metal layer 48 to form the third resist film 51. The third resist film 51 is patterned by a known exposure and development so that the resist film 51 corresponding to the first opening portion 45 becomes slightly larger in width than the first opening portion 45 and that the resist film 51 corresponding to the opening portion 46 becomes slightly larger in width than the opening portion 46. By using the third resist films 51 as masks, the metal layer 48 is etched with mixed gases (e.g., $CCl_4$ and $BCl_3$ gases) by the RIE method.

Figure 2D:
Figure 2D:
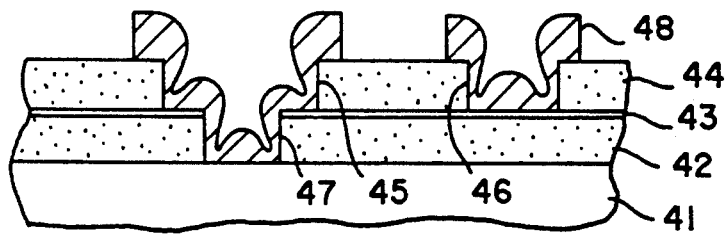
Figure 2E:
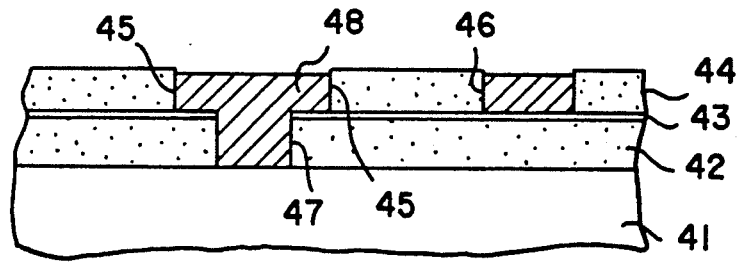

Next, as shown in FIG. 2(d), the laser beams 52 are irradiated on the metal layers 48 after the third resist films 51 have been removed from the metal layers 48. As a device for irradiating the laser beams 52, for example, a model 4100 produced by XMR company in the United States is used, and the laser beam source is a Xe-Cl excimer laser. The laser beams 52 are irradiated with a pulse width of 50 ns, pulse energy of 150 mJ, pulse irradiation dimension of 2 mm ×2 mm, pulse feed pitch of 0.5 mm, and base layer (41) temperature of 300° C. The metal layers 48 irradiated by the laser beams 52 melt and viscously flow, and are buried in the opening portions 45 and 46 and planarized, as shown in FIG. 2(e).

Since the third resist film 51 is patterned so that it becomes larger in width than the opening portions 45 and 46, the metal layer 48 in the first opening portion 45 can be separated from the metal layer 48 in the opening portion 46, as shown in FIG. 2(d), if the space between the opening portions 45 and 46 is more than 1.6 μm. If, on the other hand, the first opening portion 45, together with adjacent opening portions 53, 54, 55 and 56 arranged with spacing less than 1.6 μm, are formed, the metal layer 48 in the adjacent opening portions 53, 54, 55 and 56 becomes a continuous pattern, as shown in FIG. 3(a). However, if the laser beams 52 are irradiated on the continuous metal layer 48, the melted metal layer 48 flows into the opening portions 53–56 and are separated from one another and the upper surfaces of the separated metal layers 48 are planarized, as shown in FIG. 3(b). Note that even if the metal layer 48 in adjacent opening portions arranged with spacing of 2 μm is a continuous pattern, Al of the metal layer 48 automatically flows into the individual opening portions after irradiation of the laser beams 52 and the metal layers in the opening portions are separated from one another.

Since in the embodiment of FIGS. 2 and 3 the second insulating layer 43 is used as an etching stopper and as a light shading film, as the first opening portion 45 in which the metal layer 48 for wiring is buried is formed, the first opening portion 45 with a predetermined depth proportional to the film thickness of the third insulating film 44 can be formed with ease and high accuracy. In addition, since the first insulating film 42 is formed underneath the second insulating film 43, the second opening portion 47 can be easily formed to a desired depth by adjusting the film thickness of the first insulating film 42. Since the second insulating film 43 comprises Al₂O₃ and is formed to a relatively thicker film of more than 0.1 μm, the film 43 has absorption rate more than 30% with respect to the laser beam 52. In addition, the first insulating film 42 with a relatively larger film thickness is formed underneath the second insulating film 43. Therefore, even if, for example, a p-n junction having a depth of 0.1 μm is formed on the base layer 41, the p-n junction is normal even after irradiation of the laser beams 52 and no damage occurs in the underlying elements of the region in which the metal layer 48 is not located. In addition, even if the base layer 41 comprises a wiring layer containing Al, a planar upper wiring layer can be formed in the same manner. At the same time, since the energy of the laser beam that is irradiated on the base layer 41 containing Al becomes below 70% due to the layer containing Al₂O₃, the Al wiring layer of the base layer 41 does not suffer any damage without melting.

FIGS. 4 and 5 are diagrams used to explain another embodiment of a method of fabricating semiconductor devices according to the second invention.

In FIGS. 4 and 5, reference numeral 61 is a base layer (e.g., a silicon (Si) substrate having thermal oxidation films 61a buried therein), 62 a first insulating film (e.g., PSG), 63 a second insulating film (e.g., alumina (Al₂O₃)), 64 a third insulating film (e.g., PSG), 65 a first opening portion formed in the third insulating film 64, 66 an opening portion formed in the third insulating film 64 in close vicinity to the first opening portion 65, 67 a second opening portion formed in the first insulating film 62 and smaller in width than the first opening portion 65, 68 a metal layer for wiring (e.g., Al or Al compound), 69 a first resist film, and 70 a second resist film.

The fabrication method of FIG. 5 will hereinafter be described.

Figure 5A:
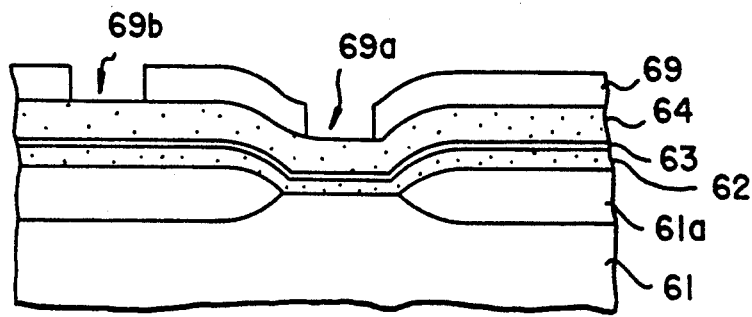
FIGS. 5(a)-5(c) are cross sectional views, partly broken away, representing the essential steps in the embodiment of FIG. 4.

First, as shown in FIG. 5(a), the thermal oxidation films 61a are formed in the base layer 61 by, for example, a selective oxidation method. The thermal oxidation films 61a formed in the base layer 61 each have a film thickness of the order of 0.6 μm. A PSG film is then grown on the base layer 61 and thermal oxidation films 61a by the chemical vapor deposition (CVD) method, and formed into the first insulating film 62 having a film thickness of the order of 0.3 μm. Alumina (Al₂O₃)) is then deposited on the first insulating file 62 by sputtering to form the second insulating film 63 having a film thickness of the order of 0.15 μm. Further, a PSG film is grown on the second insulating film 63 by the chemical vapor deposition (CVD) method, and the third insulating film 64 is formed and has a film thickness of the order of 0.7 μm. A resist film is coated on the third insulating film 64 to form the first resist film 69. The first resist film 69 is patterned by a known exposure and development so that it is formed with predetermined opening portions 69a and 69b, and the patterned first resist film 69 remains on the regions other than wiring regions (opening portions 69a and 69b).

Figure 5B:
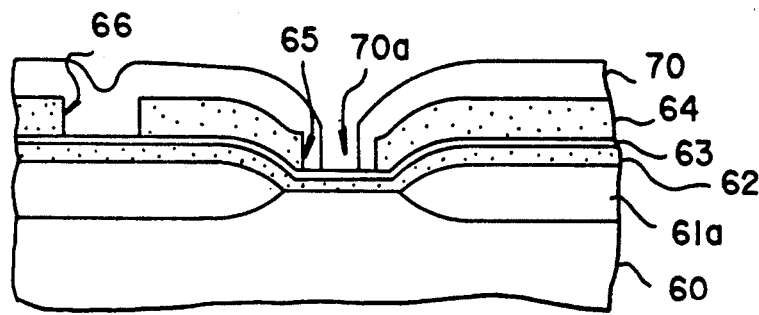

Next, as shown in FIG. 5(b), by using the patterned first resist film 69 as a mask and the second insulating film 63 as an etching stopper and as a light shading film, the third insulating film 64 is etched by the RIE method so that the first opening portion 65 and the opening portion 66 are formed. At the same time, the second insulating film 63 is exposed to the opening portions 65 and 66. Thereafter, a resist film is coated on the third insulating film 64 to form the second resist film 70. The second resist film 70 is patterned by a known exposure and development so that an opening portion 70a is formed above the first opening portion 65 of the second resist film 70.

Figure 5C:
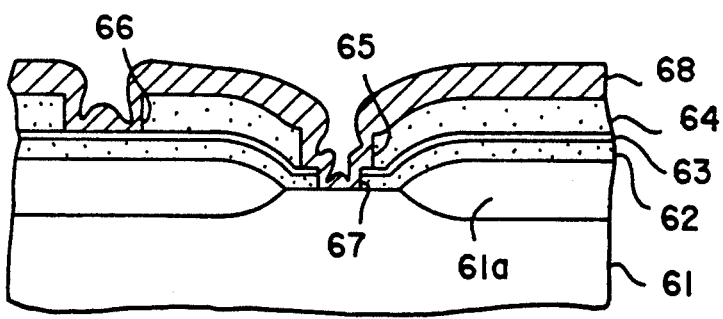

Next, as shown in FIG. 5(c), by using the patterned second resist film 70 as a mask, the second insulating film 63 is etched by the RIE method using CHF₃ gas, and further the first insulating film 62 is etched by the RIE method using Ar gas to form the second opening portion 67 to which the base layer 61 is exposed. Thereafter, the metal layer 68 is grown to have a thickness of the order of 0.6 μm by sputtering to cover the second opening portion 67 and third insulating layer 64, and contacts with the base layer 61, as shown in FIG. 5(c). The processes thereafter are the same as those of the embodiment described above, and if the processes are complete, the semiconductor as shown in FIG. 4 will be fabricated. The embodiment of FIGS. 4 and 5 can also obtain the same effect as the embodiment described above.

FIG. 6 illustrates one embodiment of a method of fabricating semiconductor devices according to a third invention.

In FIG. 6, reference numeral 81 is a base layer (e.g., a silicon (Si) substrate), 82 a first insulating film (e.g., PSG), 83 a second insulating film (e.g., alumina (Al₂O₃)), 84 a third insulating film (e.g., PSG), 85 a first opening portion formed in the second insulating film 83, 86 a second opening portion formed in the third insulating film 84, 87 an opening portion formed in the third insulating film 84 in close vicinity to the second opening portion 86, 88 a third opening portion formed in the first insulating film 82, 89 a metal layer for wiring (e.g., Al or Al compound), 90 a second resist film, 91 a third resist film, and 92 a laser beam.

The fabrication method of FIG. 6 will hereinafter be described.

Figure 6A:
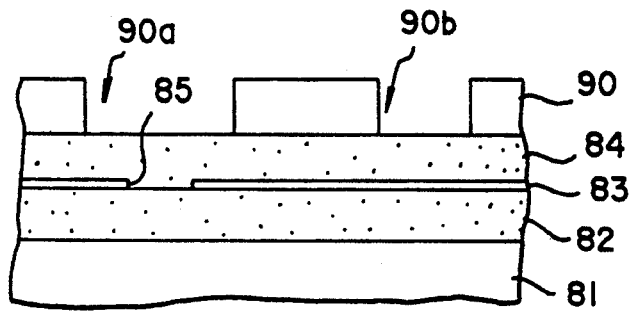
FIGS. 6(a)-6(e) are cross sectional views, partly broken away, representing the essential steps in one embodiment of a method of fabricating semiconductor devices according to a third invention.

First, as shown in FIG. 6(a), a PSG film is grown on the base layer 81 by the chemical vapor deposition (CVD) method, and the first insulating film 82 is formed and has a film thickness of the order of 0.7 μm. Alumina ($Al_2O_3$)) is then deposited on the first insulating film 82 by sputtering and the second insulating film 83 having a film thickness of the order of 0.15 μm is formed. A resist film is coated on the second insulating film 83 to form a first resist film (not shown), which is patterned by a known exposure and development. By using the patterned first resist film (not shown) as a mask, the second insulating film 83 is etched by the RIE method and the first opening portion 85 is formed. The gas used in the RIE is argon gas, the gas pressure is 0.01 Torr, and the high-frequency electric power is 5 W/cm$^2$. Further, a PSG film is grown on the second insulating film 83 by the chemical vapor deposition (CVD) method, and the third insulating film 84 is formed and deposited on the second film 83 formed with the first opening portion 85, as shown in FIG. 6(a). The third insulating film 84 has a film thickness of the order of 0.7 μm. A resist film is coated on the third insulating film 84 to form the second resist film 90. The second resist film 90 is patterned by a known exposure and development so that it is formed with predetermined opening portions 90a and 90b.

Figure 6B:
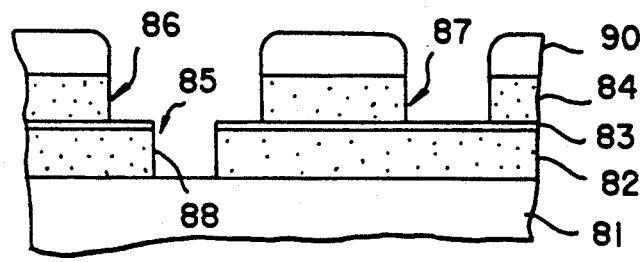

Next, as shown in FIG. 6(b), by using the patterned second resist film 90 as a mask, the third insulating film 84 and the first insulating film 82 are etched by the RIE method so that the second opening portion 86 larger in width than the first opening portion 85 and also the opening portion 87 are formed in the third insulating film 84 and that the third opening portion 88 substantially equal in width to the first opening portion 85 is formed in the first insulating film 82. At the same time, the base layer 81 is exposed to the third opening portion 88. The second opening portion 86 has a width of, for example, 1.8 μm–4 μm, and the minimum space between the second opening portion 86 and the opening portion 87 is 0.6 μm. The gas used in the RIE is CHF$_3$ gas, the gas pressure is 0.05 Torr, and the high-frequency electric power is 13.56 MHz and 4 W/cm$^2$. Since in this condition $Al_2O_3$ is not etched and only PSG is etched, selectivity is excellent. Therefore, the second insulating film 83 becomes an etching stopper with respect to the direction of depth of the second opening portion 86, and the second opening portion 86 and the third opening portion 88 are easily formed at the same time for a short period of time, since the first opening portion 85 contains no $Al_2O_3$.

Figure 6C:
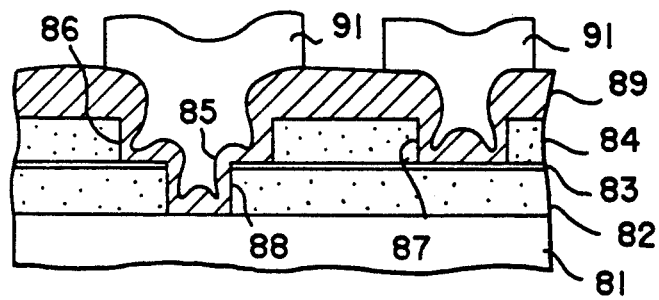

Next, as shown in FIG. 6(c), the metal layer 89 is formed by sputtering so that it covers the third opening portion 88, second opening portion 86, opening portion 87 and third insulating layer 84. A resist film is then coated on the metal layer 89 to form the third resist film 91. The third resist film 91 is patterned by a known exposure and development so that the third resist film 91 corresponding to the second opening portion 86 becomes slightly larger in width than the second opening portion 86 and that the third resist film 91 corresponding to the opening portion 87 becomes slightly larger in width than the opening portion 87. By using the patterned third resist films 91 as masks, the metal layer 89 is etched with mixed gases (e.g., $CCl_4$ and $BCl_3$ gases) by the RIE method.

Figure 6D:
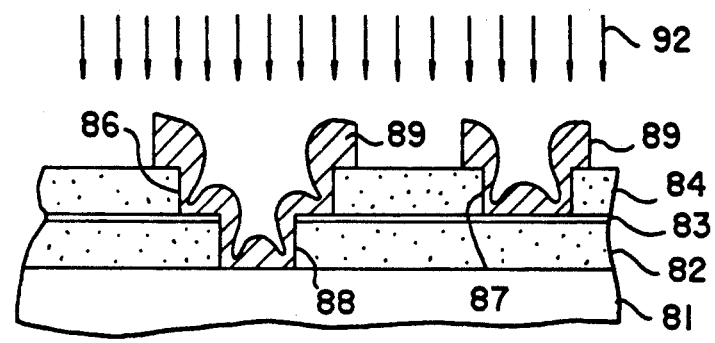
Figure 6E:
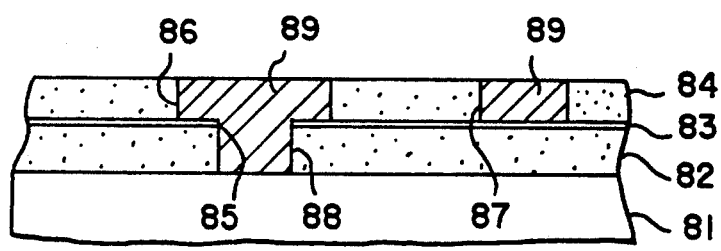

Next, as shown in FIG. 6(d), the laser beams 92 are irradiated on the metal layers 89. In the same manner described above, the metal layer 89 is buried in the first and third opening portions 85 and 88 and planarized, and also the metal layer 89 is buried in the opening portion 87 and planarized, as shown in FIG. 6(e).

As described above, in the embodiment of FIG. 6, the second opening portion 86 can be easily formed and the depth of the opening portion 86 accurately adjusted by using the second insulating film 83 as an etching stopper and as a light shading film. In addition, the second opening portion 86 and the third opening portion 88, which are different in width, are formed at the same time with the same etching gas, so that the number of processes can be reduced. Furthermore, the metal layer 89 can be made planar and at the same time a decrease in the operating speed of a circuit and a short circuit between the metal layers 89 can be prevented.

FIG. 7 is a diagram used to explain another embodiment of a method of fabricating semiconductor devices according to the third invention.

In FIG. 7, reference numeral 101 is a base layer (e.g., a silicon (Si) substrate having thermal oxidation films 101a buried therein), 102 a first insulating film (e.g., PSG), 103 a second insulating film (e.g., alumina ($Al_2O_3$)), 104 a third insulating film (e.g., PSG), 105 a first opening portion formed in the second insulating film 103, 106 a second opening portion formed in the third insulating film 104, 107 an opening portion formed in the third insulating film 104 in close vicinity to the second opening portion 106, 108 a first opening portion formed in the first insulating layer 102, 109 a metal layer for wiring (e.g., Al or Al compound), and 110 a second resist film.

The fabrication method of FIG. 7 will hereinafter be described.

Figure 7A:
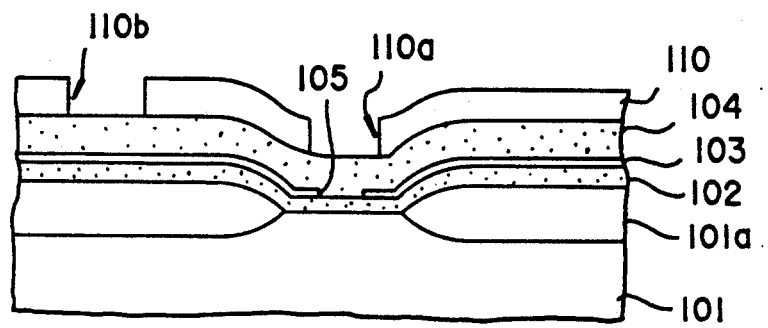
FIGS. 7(a)-7(c) are cross sectional views, partly broken away, representing the essential steps in another embodiment of a method of fabricating semiconductor devices according to the third invention.

First, as shown in FIG. 7(a), the thermal oxidation films 101a are formed in the base layer 101 by, for example, a selective oxidation method. The thermal oxidation films 101a formed in the base layer 101 each have a film thickness of the order of 0.6 μm. A PSG film is then grown on the base layer 101 and thermal oxidation films 101a by the chemical vapor deposition (CVD) method, and the first insulating film 102 is formed and has a film thickness of the order of 0.3 μm. Alumina ($Al_2O_3$)) is then deposited on the first insulating file 102 by sputtering and the second insulating film 103 having a film thickness of the order of 0.15 μm is formed. A resist film is coated on the second insulating film 103 to form a first resist film (not shown). By patterning the first resist film and using it as a mask, the second insulating film 103 is etched by the RIE method so that the first opening portion 105 is formed in the film 103. Further, a PSG film is grown on the second insulating film 103 formed with the first opening portion 105 by the chemical vapor deposition (CVD) method, so that the third insulating film 104 is formed and has a film thickness of the order of 0.7 μm. A resist film is coated on the third insulating film 104 to form the second resist film 110. The first resist film 110 is patterned by a known exposure and development so that it is formed with predetermined opening portions 110a and 110b for forming wiring regions.

Figure 7B:
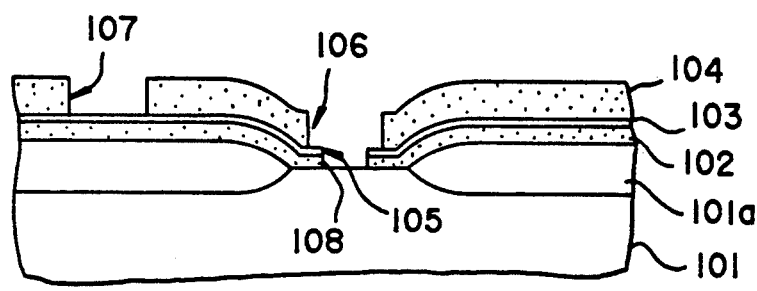

Next, as shown in FIG. 7(b), by using the patterned second resist film 110 as a mask and the second insulating film 103 as an etching stopper and as a light shading film, the third insulating film 104 is etched by the RIE method so that the second opening portion 106 larger in width than the first opening portion 105 and also the opening portion 107 adjacent to the second opening portion 106 are formed in the third insulating film 104. The first insulating film 105 is also etched through the first opening portion 105 to form the third opening portion 108 to which the base layer 101 is exposed.

Figure 7C:
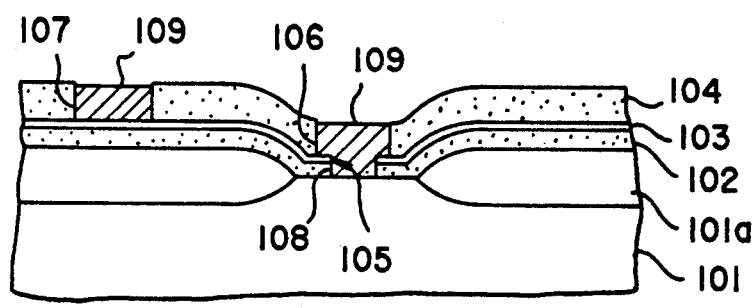

Next, as shown in FIG. 7(c), Al or Al compound is grown to a thickness of the order of 0.6 μm on the third insulating film 104 by sputtering to form the metal layer 109 which is contacted through the third opening portion 108 with the base layer 101. After the portion of the metal layer 109 which is spaced more than 1 μm from the second opening portion 106 has been removed by etching, the laser beams are irradiated like the above described embodiment and laser annealing processing is performed. Consequently, the metal layer 109 is buried in the first, second and third opening portions 105, 106 and 108 and planarized, and also the metal layer 109 is buried in the opening portion 107 and planarized. The embodiment of FIG. 7 can also obtain the same effect as the embodiment described above.

FIG. 8 illustrates one embodiment of a method of fabricating semiconductor devices according to a fourth invention.

In FIG. 8, reference numeral 121 is a base layer (e.g., a silicon (Si) substrate), 122 a first insulating film (e.g., PSG), 123 a second insulating film (e.g., alumina (Al$_2$O$_3$)) smaller in etch rate than the first insulating film 122 (PSG), 124 third insulating film (e.g., PSG), 125 a first opening portion formed in the first and second insulating films 122 and 123, 126 a second opening portion formed in the third insulating film 124, 127 an opening portion formed in the third insulating film 124 in close vicinity to the second opening portion 126, 128 a sidewall insulating film formed in the first opening portion 125, 129 a metal layer for wiring (e.g., Al or Al compound), 130 a first resist film, and 131 a second resist film.

The fabrication method of FIG. 8 will hereinafter be described.

Figure 8A:
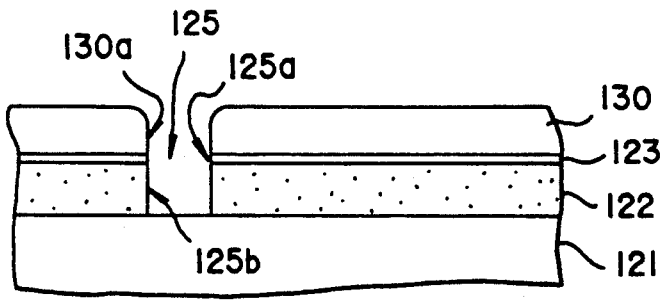
FIGS. 8(a)-8(d) are cross sectional views, partly broken away, representing the essential steps in one embodiment of a method of fabricating semiconductor devices according to a fourth invention.

First, as shown in FIG. 8(a), a PSG film is grown on the base layer 121 by the chemical vapor deposition (CVD) method, so that the first insulating film 122 is formed and has a film thickness of the order of 0.7 μm. Alumina (Al$_2$O$_3$)) is then deposited on the first insulating film 122 by sputtering and the second insulating film 123 having a film thickness of the order of 0.15 μm is formed. A resist film is coated on the second insulating film 123 to form a first resist film 130, which is patterned by a known exposure and development. By using the patterned first resist film 130 as a mask, the second insulating film 123 is etched by the RIE method using argon (Ar) gas, and an opening portion 125a is formed and the first insulating film 122 is exposed to the opening portion 125a. The exposed first insulating film 122 is then etched by the RIE method using argon CHF$_3$ gas to form therein an opening portion 125b. That is to say, the first insulating film 122 is exposed to the first opening portion 125 comprising the opening portions 125a and 125b by etching the first insulating film 122 and second insulating film 123.

Figure 8B:
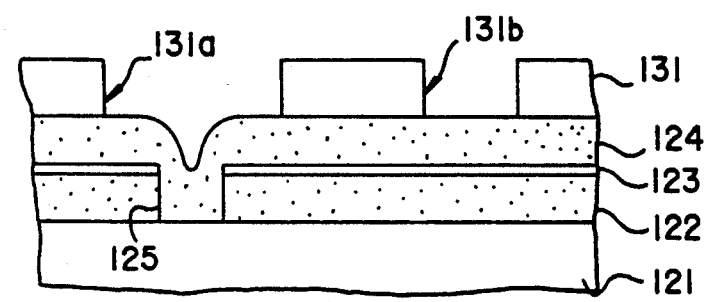

Next, as shown in FIG. 8(b), a PSG film is grown on the second insulating film 123 by the chemical vapor deposition (CVD) method so that the third insulating film 124 is deposited on the second film 123 and also buried the first opening portion 125. A resist film is coated on the third insulating film 124 to form the second resist film 131. The second resist film 131 is patterned by a known exposure and development so that it is formed with predetermined opening portions 131a and 131b for wiring regions.

Figure 8C:
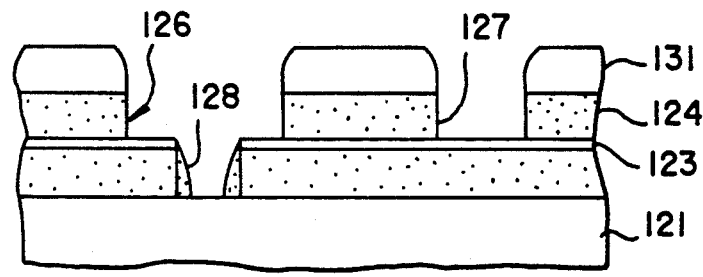

Next, as shown in FIG. 8(c), by using the patterned second resist film 131 as a mask and the second insulating film 123 as an etching stopper and as a light shading film, the third insulating film 124 is etched by the RIE method, so that the second opening portion 126 and the opening portion 127 adjacent to the second opening portion 126 are formed. At the same time, by controlling the amount that the third insulating film 123 is etched, the sidewall insulating film is formed on the sidewalls of the first and second insulating films 122 and 123 within the first opening portion 125. To an opening portion defined by the sidewall insulating film 128 is exposed the base layer 121.

Figure 8D:
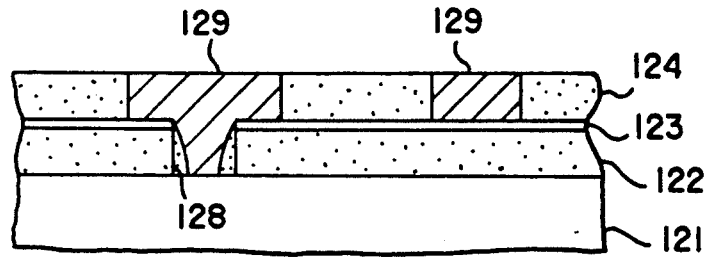
Figure 9A:
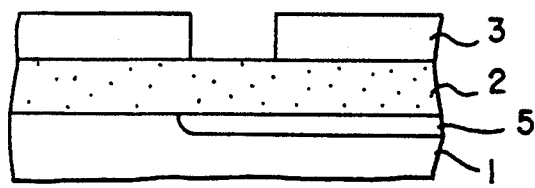
FIGS. 9(a)-9(d) are cross sectional views, partly broken away, representing the essential steps in a conventional method of fabricating semiconductor devices.
Figure 9B:
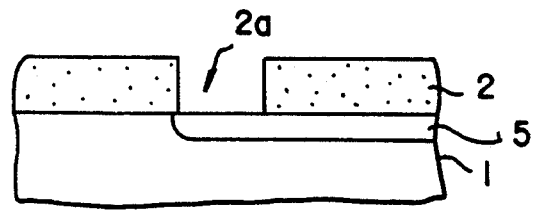
Figure 9C:
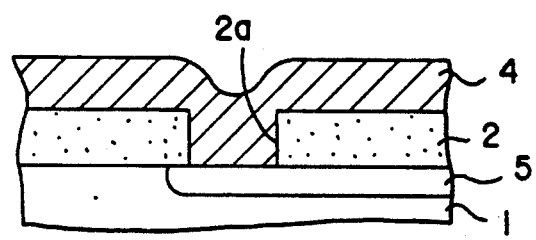
Figure 9D:
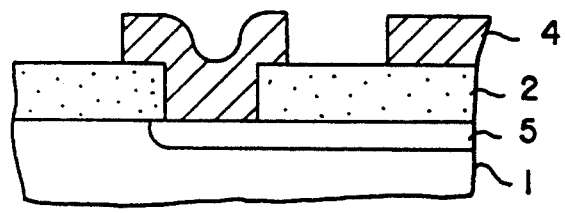
Figure 10:
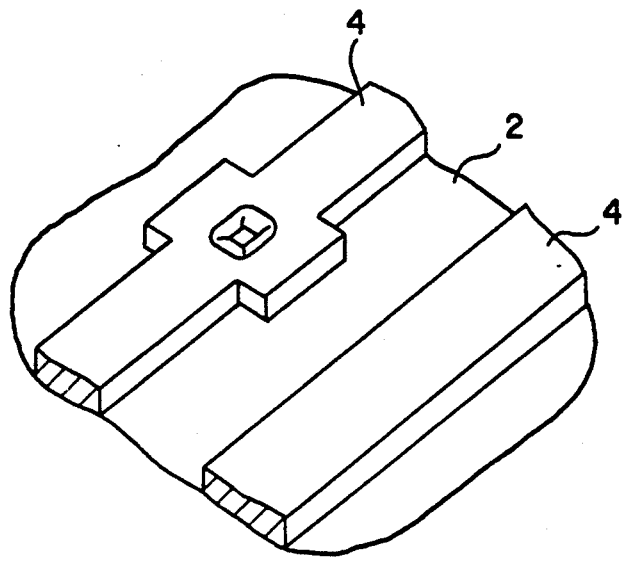
FIG. 10 is a perspective view, partly broken away, showing the wiring part of the semiconductor device formed by the conventional method of FIG. 9.
Figure 14A:
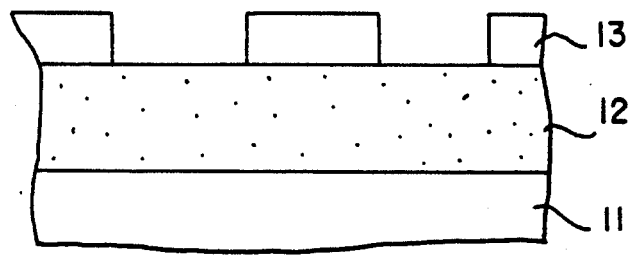
FIGS. 14(a)-14(d) are cross sectional views, partly broken away, representing the essential steps in a third conventional method of fabricating semiconductor devices.
Figure 14B:
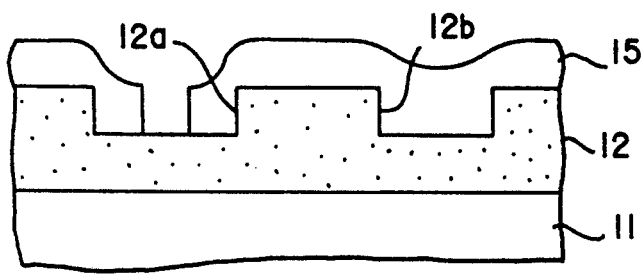
Figure 14C:
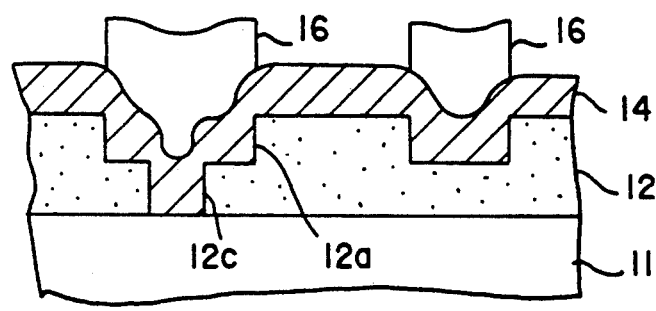
Figure 14D:
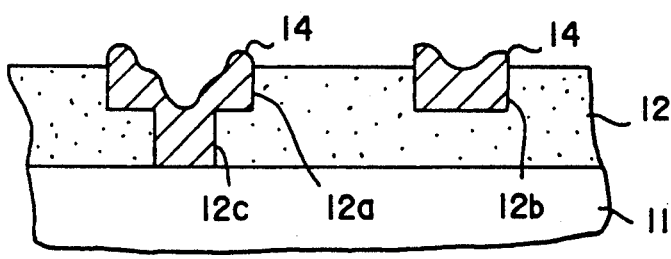
Figure 15:
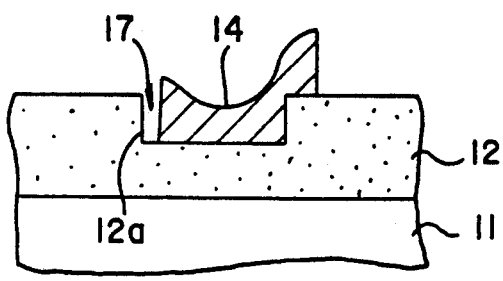
FIG. 15 is a cross sectional view to explain the problems as produced by the conventional method of FIG. 14.

Next, as shown in FIG. 8(d), Al or Al compound is grown by sputtering so that it contacts with the base layer 121 exposed to the first opening portion 125, and the metal layer 129 covering the third insulating film 124 is formed. After formation of the metal layer 129, it is patterned by removing the portions of the metal layer 129, which are spaced a predetermined dimension from the second opening portion 126 and from the opening portion 127, by etching. As described above, the laser annealing processing is then performed. Consequently, the metal layer 109 is buried in the first opening portion 125 and second opening portion 126 and planarized.

As described above, in the embodiment of FIG. 8, when the third insulating film 124 is etched to form the second opening portion 126, the second opening portion 126 can be easily formed and the depth of the opening portion 126 accurately adjusted, because the second insulating film 123 smaller in etch rate than the third insulating film 124 is used as an etching stopper and as a light shading film. At the same time, since the sidewall insulating film 128 is formed within the first opening portion 125, the exposed area of the base layer 121 can be reduced. Therefore, if a bipolar transistor is formed on the base layer 121, the dimension of the emitter can be reduced as compared with a normal case having no sidewall insulating film 128. Consequently, an excellent current gain $h_{fe}$ and an excellent switching speed can be obtained.

In the above described embodiments of the first to fourth inventions, copper (Cu) can be grown on the metal layer 48, 68, 89, 109 or 129 so that it has a film thickness of, for example, 300 angstroms. In that case, it is of course that the shape of the wiring layer can be made planar, and furthermore an electron migration resistance as current flows through wirings can be enhanced, since Cu mixes with Al. In addition, since the reflectivity of Cu with respect to a laser beam is smaller than that of Al, a better energy absorption of the laser beam is obtained. As a result, the irradiation area of the laser beam is doubled as compared with the case of Al, and the throughput is also enhanced. The increase in the irradiation area is also accomplished by a metal layer comprising Cu or Cu compound instead of Al or Al compound. In addition, the same effect as Cu was also obtained in the case of Ti having a small reflectivity.

Furthermore, the film thickness of the metal layer after it has been planarized can be made more uniform by making the metal layer in the vicinity of the opening portion, under which an inner window for contact is formed, thicker than the metal layer on other opening portions, or by reducing the width dimension of the opening portion under which an inner window for contact is formed, when the metal layer is etched and patterned.

In addition to a Si layer of a semiconductor substrate and a diffusion layer, the base layer according to the present invention can also be a wiring layer comprising a conductive substance such as a metal. While the present invention has been described with a single layer wiring, it can also be applied to a multilayer wiring.

In accordance with the present invention, by using the insulating film smaller in etch rate that the upper layer as an etching stopper, the depth of the opening portion (groove) of the wiring layer can be controlled easily and accurately, and the wiring layer can be buried within the opening portion and planarized by laser irradiation. As a result, the planarizing of the wiring layer can be achieved completely. In addition, by forming the insulating film having a better absorption with respect to a laser beam, damages to elements by the laser irradiation can be prevented.

While certain representative embodiments and details have been shown for the purpose of illustrating the invention, it will be apparent to those skilled in this art that various changes and modifications may be made therein without departing from the scope of the invention.

What we claim is:

1. A method of fabricating semiconductor devices, comprising the steps of:
    forming a plurality of insulating films on a base layer, said plurality of insulating films comprising at least a first insulating film, a second insulating film, and a third insulating film, said second insulating film located between said first and third insulating films and said second insulating film being smaller in etch rate than said first and third insulating films and serving as an etching stopper and as a light shading film;
    forming a first opening portion by etching said third insulating film, and exposing said second insulating film to said first opening portion;
    forming a second opening portion smaller in width than said first opening portion by etching said second insulating film exposed to said first opening portion and etching said first insulating film, and exposing said base layer to said second opening portion;
    forming a metal layer in said first and second opening portions so that said metal layer can contact with said base layer exposed to said second opening portion; and
    burying said metal layer in said first and second opening portions and planarizing the buried metal layer by irradiating said metal layer with a laser beam.

2. A method of fabricating semiconductor devices as set forth in claim 1, wherein said second insulating film has absorption rate more than 30% with respect to said laser beam so that said base layer is not damaged.

3. A method of fabricating semiconductor devices as set forth in claim 1, wherein said base layer comprises aluminum, aluminum base compound, copper, copper base compound, single crystal silicon, polycrystal silicon, or a compound semiconductor selected from the group consisting of GaAs and AlGaAs.

4. A method of fabricating semiconductor devices as set forth in claim 1, wherein said first insulating film comprises a silicon (Si) oxidation film or a Si oxidation film containing phosphorus (P), said second insulating film comprises $Al_2O_3$, and said third insulating film comprises a silicon (Si) oxidation film or a Si oxidation film containing phosphorus (P).

5. A method, of fabricating semiconductor devices as set forth in claim 1, wherein said laser beam comprises an excimer laser beam.

6. A method of fabricating semiconductor devices as set forth in claim 5, wherein said metal layer comprises aluminum (Al), Al base compound, copper (Cu), or Cu base compound.

7. A method of fabricating semiconductor devices, comprising the steps of:
    forming a first insulating film and a second insulating film of a plurality of insulating films sequentially on a base layer, said second insulating film formed on said first insulating film and being smaller in etch rate than said first insulating film, said second insulating film serving as an etching stopper and as a light shading film;
    forming a first opening portion by etching said second insulating film, and exposing said first insulating film to said first opening portion;
    forming a third insulating film of said plurality of insulating films on said second insulating film and in said first opening portion so that said second insulating film and said first opening portion are covered with said third insulating film, said second insulating film being smaller in etch rate than said third insulating film;
    etching said third insulating film and first insulating film at said first opening portion to form a) a second opening portion, which is larger in width than said first opening portion, in the third insulating film and b) a third opening portion, which is substantially equal in width to said first opening portion, in said first insulating layer, and exposing said base layer to said third opening portion;
    forming a metal layer in said first, second and third opening portions so that said metal layer can contact with said base layer exposed to said third opening portion; and
    burying said metal layer in said first, second and third opening portions and planarizing the buried metal layer by irradiating said metal layer with a laser beam.

8. A method of fabricating semiconductor devices as set forth in claim 7, wherein said second insulating film has absorption rate more than 30% with respect to said laser beam so that said base layer is not damaged.

9. A method of fabricating semiconductor devices as set forth in claim 7, wherein said base layer comprises aluminum, aluminum base compound, copper, copper base compound, single crystal silicon, polycrystal silicon, or a compound semiconductor selected from the group consisting of GaAs and AlGaAs.

10. A method of fabricating semiconductor devices as set forth in claim 7, wherein said first insulating film comprises a silicon (Si) oxidation film or a Si oxidation film containing phosphorous (P), said second insulating film comprises $Al_2O_3$, and said third insulating film comprises a silicon (Si) oxidation film or a Si oxidation film containing phosphorous (P).

11. A method of fabricating semiconductor devices as set forth in claim 7, wherein said laser beam comprises an excimer laser beam.

12. A method of fabricating semiconductor devices as set forth in claim 11, wherein said metal layer comprises aluminum (Al), Al base compound, copper (Cu), or Cu base compound.

13. A method of fabricating semiconductor devices, comprising the steps of:

forming a first insulating film and a second insulating film of a plurality of insulating films sequentially on a base layer, the second insulating film formed on said first insulating film, said second insulating film being smaller in etch rate than said first insulating film and serving as an etching stopper and as a light shading film;

forming a first opening portion by etching said second and first insulating films;

forming a third insulating film of said plurality of insulating films on said second insulating film and in said first opening portion so that said second insulating film and said first opening portion are covered with said third insulating film, said second insulating film being smaller in etch rate than said third insulating film;

etching said third insulating film on said first opening portion forming a second opening portion, which is larger in which than said first opening portion, in said third insulating film and also said etching causing said third insulating film to form a sidewall insulating film on sidewalls of said first and second insulating films within said first opening portion and further said etching exposing said base layer to an opening portion defined by said sidewall insulating film;

forming a metal layer in said first and second opening portions so that said metal layer can contact with said base layer exposed to said opening portion defined by said sidewall insulating film; and burying said metal layer in said first and second opening portions and planarizing the buried metal layer by irradiating said metal layer with a laser beam.

14. A method of fabricating semiconductor devices as set forth in claim 13, wherein said second insulating film has absorption rate more than 30% with respect to side laser beam so that said base layer is not damaged.

15. A method of fabricating semiconductor devices as set forth in claim 13, wherein said base layer comprises aluminum, aluminum base compound, copper, copper base compound, single crystal silicon, polycrystal silicon, or a compound semiconductor selected from the group consisting of GaAs and AlGaAs.

16. A method of fabricating semiconductor devices as set forth in claim 13, wherein said first insulating film comprises a silicon (Si) oxidation film or a Si oxidation film containing phosphorus (P), said second insulating film comprises $Al_2O_3$, and said third insulating film comprises a silicon (Si) oxidation film or a Si oxidation film containing phosphorus (P).

17. A method of fabricating semiconductor devices as set forth in claim 13, wherein said laser beam comprises an excimer laser beam.

18. A method of fabricating semiconductor devices as set forth in claim 17, wherein said metal layer comprises aluminum (Al), Al base compound, copper (Cu), or Cu base compound.

* * * * *